(12) United States Patent
Kim (10) Patent No.: US 7,256,631 B2
(45) Date of Patent: Aug. 14, 2007

(54) CHARGE PUMP WITH BALANCED AND CONSTANT UP AND DOWN CURRENTS

(75) Inventor: Ju-Hyung Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 28 days.

(21) Appl. No.: 11/188,833

(22) Filed: Jul. 25, 2005

(65) Prior Publication Data

US 2006/0022727 A1 Feb. 2, 2006

(30) Foreign Application Priority Data

Aug. 2, 2004 (KR) ..................... 10-2004-0060763

(51) Int. Cl.
*H03L 7/06* (2006.01)
(52) U.S. Cl. .................... 327/157; 327/156; 327/536
(58) Field of Classification Search ............... 327/156, 327/157, 147, 148, 536
See application file for complete search history.

(56) References Cited

U.S. PATENT DOCUMENTS

| | | | | |
|---|---|---|---|---|
| 5,008,637 A | * | 4/1991 | Ray ....................... 331/8 |
| 5,592,120 A | * | 1/1997 | Palmer et al. ............ 327/536 |
| 5,663,689 A | * | 9/1997 | Baumgartner et al. ...... 331/17 |
| 6,107,889 A | | 8/2000 | Strange et al. ............ 331/17 |
| 6,853,253 B2 | * | 2/2005 | Desortiaux ............... 331/16 |

OTHER PUBLICATIONS

Japanese Patent Application No. 11-088402 to Kokubo et al, having Publication date of Oct. 13, 2000 (w/ English Abstract page).
Japanese Patent Application No. 11-037065 to Diorio, having Publication date of Oct. 29, 1999 (w/ English Abstract page).

* cited by examiner

*Primary Examiner*—Linh My Nguyen
*Assistant Examiner*—Colleen O'Toole
(74) *Attorney, Agent, or Firm*—Monica H. Choi (57) ABSTRACT

A charge pump generates a first sub up current and a second sub up current that vary complementarily with a change in a voltage at an output terminal. The charge pump also generates a first sub down current and a second sub down current that vary complementarily with the change in the voltage at the output terminal. With such complementary relationships, the total up/down currents remain substantially constant and balanced with the change in the voltage at the output terminal.

20 Claims, 9 Drawing Sheets

CHARGE PUMP WITH BALANCED AND CONSTANT UP AND DOWN CURRENTS

BACKGROUND OF THE INVENTION

This application claims priority under 35 USC § 119 to Korean Patent Application No. 2004-60763, filed on Aug. 2, 2004, the contents of which are incorporated herein by reference in their entirety for all purposes.

1. Field of the Invention

The present invention relates generally to charge pumps, and more particularly to a charge pump having up and down currents that are balanced and constant for reducing jitter in a phase-locked loop.

2. Description of the Related Art

A phase-locked loop (PLL) is widely used for various applications such as a clock recovery circuit in a communication system or a frequency synthesizer for synthesizing a higher frequency using a lower frequency. In general, the phase-locked loop includes a phase frequency detector (PFD), a charge pump, a loop filter, and a voltage-controlled oscillator (VCO).

Figure 1:
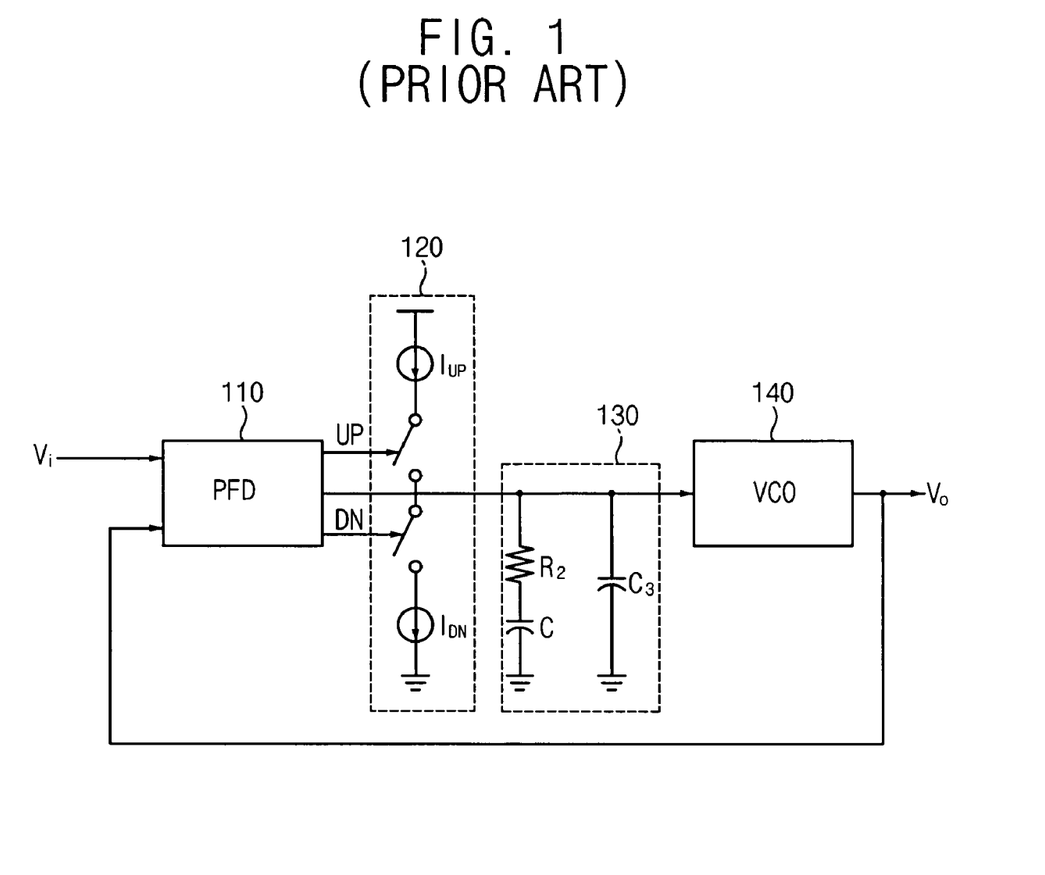
FIG. 1 is a block diagram of a conventional phase-locked loop.

FIG. 1 is a block diagram illustrating a conventional phase-locked loop. Referring to FIG. 1, a phase frequency detector 110 generates an up signal UP and a down signal DN based on a phase (or frequency) difference between a reference signal Vi and a feedback signal Vo. A charge pump 120 draws an up current IUP through a loop filter 130 when the up signal UP is activated or draws a down current IDN from the loop filter 130 when the down signal DN is activated. The loop filter 130 is charged or discharged in response to the up/down currents IUP/IDN to generate a loop filter voltage.

A voltage-controlled oscillator 140 generates the feedback signal Vo based on the loop filter voltage. In this manner, the up signal UP and the down signal DN are generated such that a phase (or frequency) difference between the reference signal Vi and the feedback signal Vo is reduced.

Figure 2A:
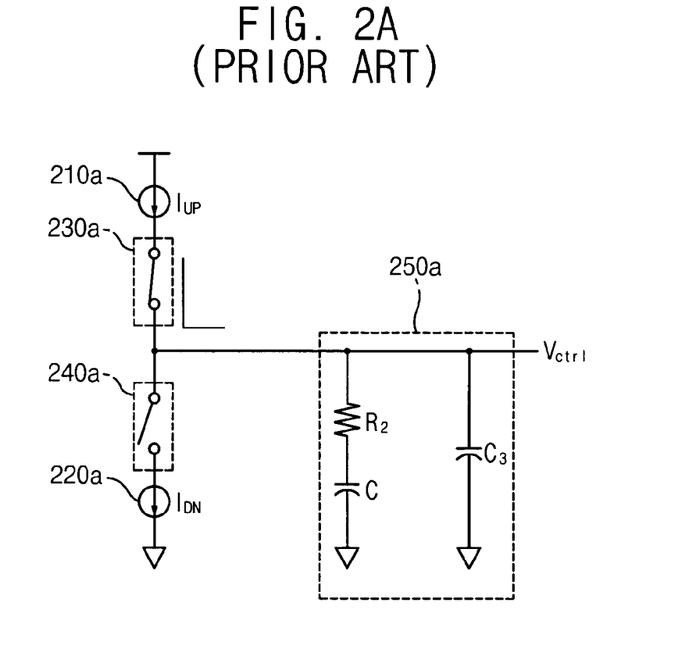
FIGS. 2A and 2B are schematic views illustrating operation of a charge pump of the prior art.
Figure 2B:
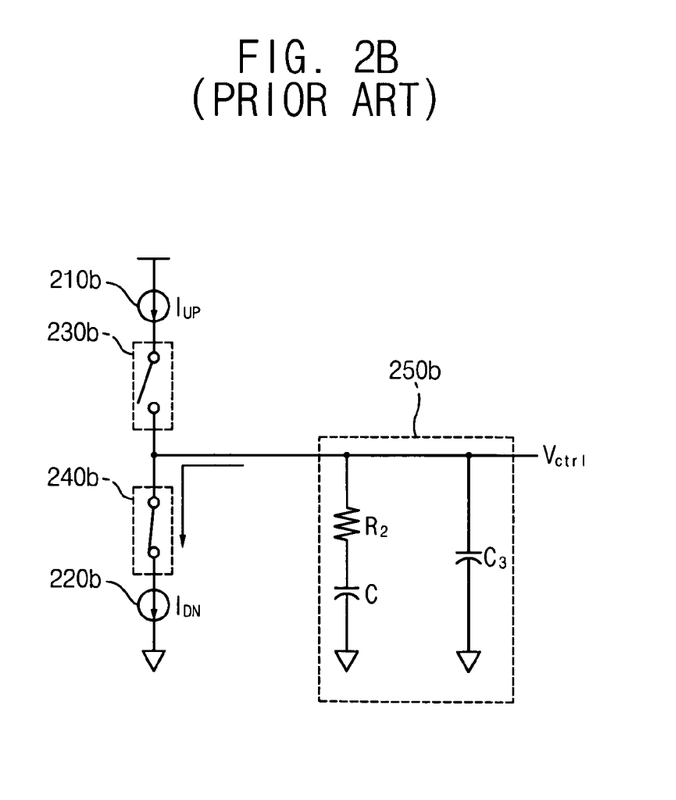

FIGS. 2A and 2B illustrate operation of the charge pump 120 in response to the up signal and the down signal. Referring to FIG. 2A, an up switch 230a is closed when the up signal UP is activated such that the up current IUP is supplied from an up current source 210a to charge a loop filter 250a. Referring to FIG. 2B, a down switch 240b is closed when the down signal DN is activated such that the down current IDN is drawn by a down current source 210b to discharge a loop filter 250b. The loop filters 250a and 250b, charged or discharged, generate a control signal Vctrl provided to the VCO 140.

An important performance aspect of the phase-locked loop depends on a performance of the charge pump. Particularly, the charge pump is desired to operate over a wide voltage range with balanced up and down currents IUP and IDN. When the up current IUP is not substantially matched with the down current IDN, a ripple may be continuously generated when the phase-locked loop is locked. Moreover, jitter may be disadvantageously increased due to degradation of tracking characteristics.

Figure 3:
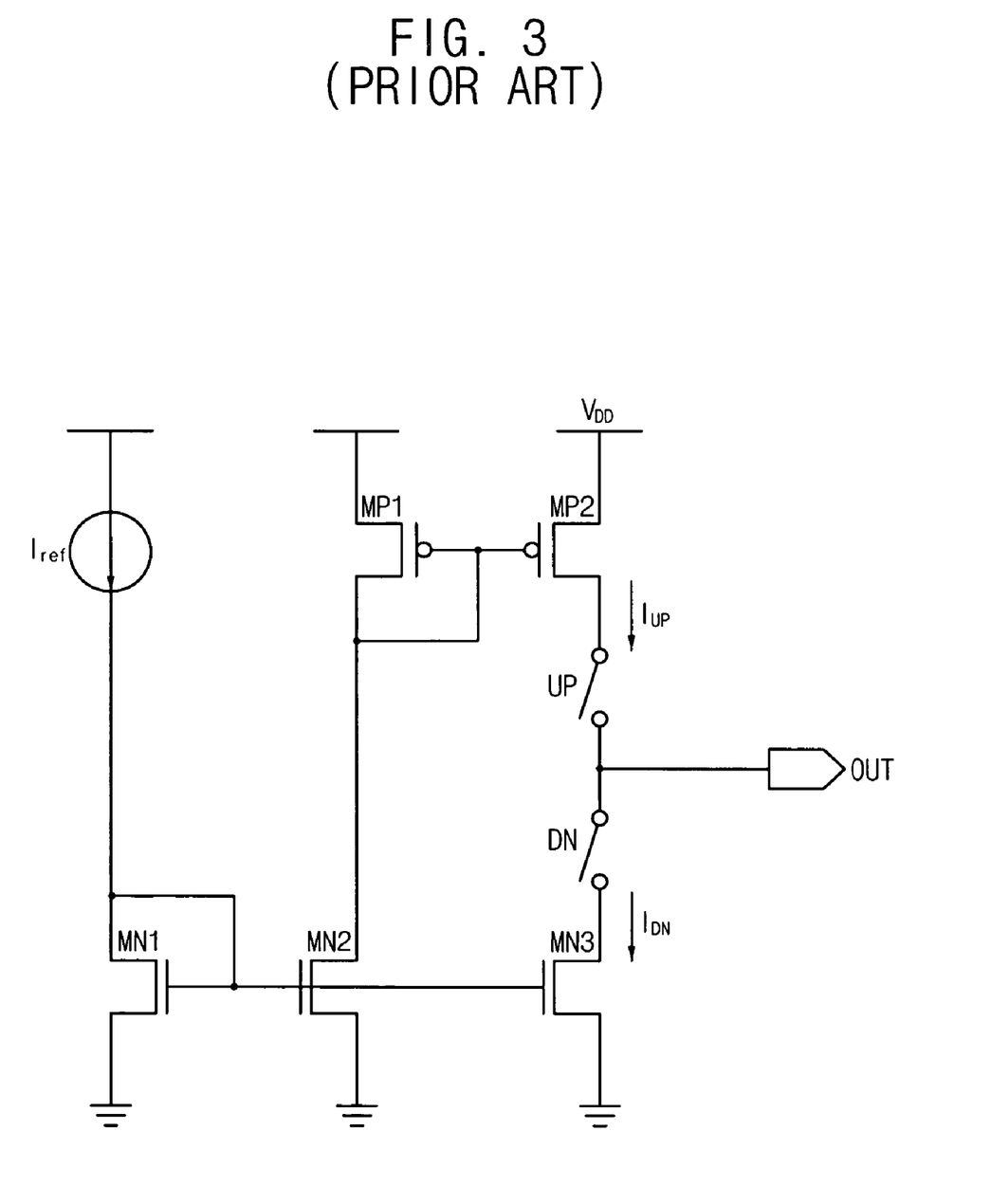
FIG. 3 is a circuit diagram of a conventional charge pump.

FIG. 3 is a circuit diagram illustrating a conventional charge pump. Referring to FIG. 3, the conventional charge pump includes a reference current source Iref, PMOS (P-channel metal oxide semiconductor) transistors MP1 and MP2, NMOS (N-channel metal oxide semiconductor) transistors MN1, MN2 and MN3, and up/down switches UP and DN. The NMOS transistor MN1 and the PMOS transistor MP1 form a current mirror with the NMOS transistor MN2 and the PMOS transistor MP2, respectively, to produce the up current IUP proportional to a current drawn from the reference current source Iref. The NMOS transistor MN3, forming a current mirror with the NMOS transistor MN1, produces the down current IDN proportional to the current drawn from the reference current source Iref.

The up switch UP is closed when the up signal UP is activated such that the up current IUP flows to an output terminal OUT of the charge pump. Alternatively, the down switch DN is closed when the down signal DN is activated to draw the down current IDN from the output terminal OUT. One of the up signal and down signal UP and DN is activated.

The up and down currents IUP and IDN are desired to be the same, and such currents are both generated by mirroring the reference current Iref. However, as a voltage at the output terminal OUT varies in a range from about OV to about VDD, the up and down currents IUP and IDN become different from each other because the PMOS and NMOS transistors MP2 and MN3 have finite resistance.

That is, the PMOS and NMOS transistors MP2 and MN3 operate in a saturation region where a drain current Ids of each of such transistors varies with the drain-to-source voltage Vds as follows:

$$Ids = \frac{1}{2}\mu Cox \frac{W}{L}(Vgs - Vth)^2(1 + \lambda Vds), \qquad \text{[Expression 1]}$$

wherein μ is a mobility of a charge carrier in a channel, Cox is a capacitance per unit area formed by a gate electrode and the channel, W is a width of the channel, L is a length of the channel, Vgs is a gate-to-source voltage, Vth is a threshold voltage of the transistor, and λ is a channel length modulation coefficient.

Thus, the drain current Ids increases as the drain-to-source voltage Vds increases, and the drain current Ids decreases as the drain-to-source voltage Vds decreases, for the NMOS transistor. On the other hand, the drain current Ids increases as the source-to-drain voltage Vsd increases, and the drain current Ids decreases as the source-to-drain voltage Vsd decreases, for the PMOS transistor.

Therefore, when the voltage at the output terminal OUT of the charge pump in FIG. 3 is increased, the source-to-drain voltage Vsd of the PMOS transistor MP2 is decreased, thereby decreasing the up current IUP. Also, the drain-to-source voltage Vds of the NMOS transistor MN3 is increased, thereby increasing the down current IDN. Conversely, when the voltage at the output terminal OUT is decreased, the source-to-drain voltage Vsd of the PMOS transistor MP2 is increased, thereby increasing the up current IUP. Also, the drain-to-source voltage Vds of the NMOS transistor MN3 is decreased, thereby decreasing the down current IDN. Thus, the up current IUP and the down current IDN may not be precisely matched from the variation of the voltage at the output terminal OUT.

Figure 4:
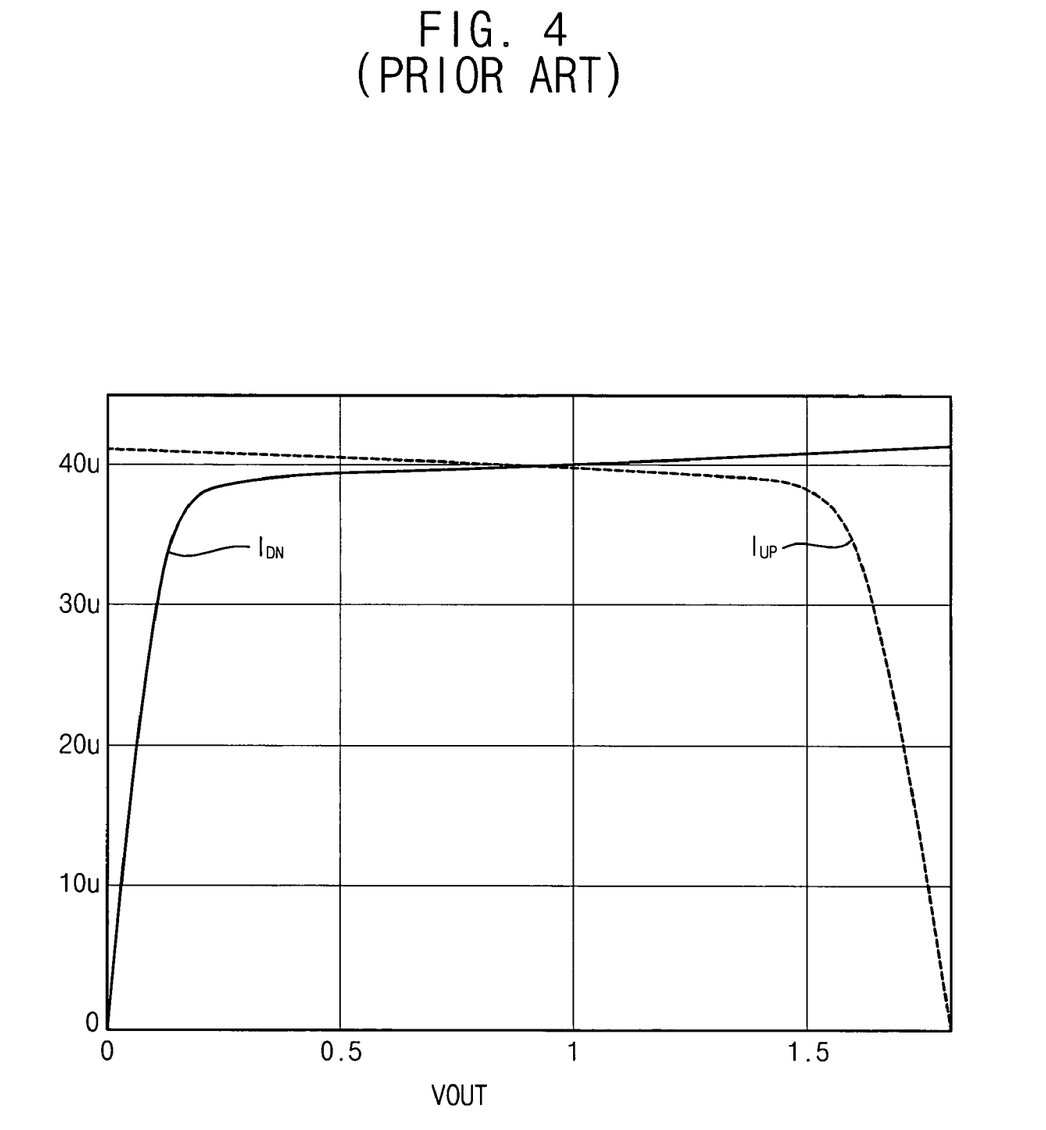
FIG. 4 is a plot of simulation results for up and down currents with variation of an output voltage of the charge pump in FIG. 3.

FIG. 4 is a plot illustrating simulation results for the up current IUP and the down current IDN according to the voltage VOUT at the output terminal of the charge pump in FIG. 3. Referring to FIG. 4, as the output voltage VOUT increases, the up current IUP decreases while the down current IDN increases resulting in a current mismatch which in turn may result in jitter of the phase-locked loop.

A phase locked loop charge pump circuit as disclosed in U.S. Pat. No. 6,107,889 includes a reference current loop for generating a reference current proportional to a reference voltage and a replication feedback loop for replicating a loop filter voltage at a coupling node to provide the reference current as an up current. According to U.S. Pat. No. 6,107,889, the up current is replicated from the down current so that the up current may be substantially identical to the down current.

However, the charge pump circuit disclosed in U.S. Pat. No. 6,107,889 changes the up current according to the change of the down current for enhanced current matching. However, such up and down currents still have variance. For example, when the down current is changed by ΔI, the up current is also changed by ΔI from matching with the down current. Such current variance may lower the operating speed of the phase-locked loop and may affect frequency characteristics of the phase-locked loop to degrade the performance of the phase-locked loop. Therefore, a charge pump that generates the up/down currents that are balanced at a constant current level is desired.

SUMMARY OF THE INVENTION

Accordingly, a charge pump according to example embodiments of the present invention generates up/down currents that remain constant and balanced over a range of a voltage at an output terminal.

A charge pump in one embodiment of the present invention includes sub up current sources for generating a first sub up current and a second sub up current that vary complementarily with a change in a voltage at an output terminal. The charge pump also includes sub down current sources for generating a first sub down current and a second sub down current that vary complementarily with the change in the voltage at the output terminal.

In another embodiment of the present invention, the sub up current sources include a first sub up current source and a second sub up current source. The first sub up current source generates the first sub up current that is mirrored from a reference current, and the second sub up current source generates the second sub up current that is mirrored from the first sub down current.

In an example embodiment of the present invention, the first sub up current source is comprised of a pair of NMOS transistors forming a first current mirror, and a pair of PMOS transistors forming a second current mirror.

Furthermore, the second sub up current source includes a pair of NMOS transistors forming a first current mirror and a pair of PMOS transistors forming a second current mirror coupled to the first current mirror at a common node. In that case, each of the first and second current mirrors has the first sub down current flowing therein, and an operational amplifier is configured to maintain a voltage at the common node substantially equal to the voltage at the output terminal.

In a further embodiment of the present invention, the sub down current sources include a first sub down current source and a second sub down current source. The first sub down current source generates the first sub down current that is mirrored from a reference current. The second sub down current source generates the second sub down current that is mirrored from the first sub up current.

In an example embodiment of the present invention, the first sub down current source is comprised of a pair of NMOS transistors forming a current mirror. Furthermore, the second sub down current source includes a pair of PMOS transistors forming a first current mirror and a pair of NMOS transistors forming a second current mirror coupled to the first current mirror at a common node. In that case, each of the first and second current mirrors has the first sub up current flowing therein, and an operational amplifier is configured to maintain a voltage at the common node substantially equal to the voltage at the output terminal.

In a further embodiment of the present invention, the charge pump includes up switches and down switches. The up switches close in response to a first control signal such that the first and second sub up currents flow to the output terminal, and the down switches close in response to a second control signal such that the first and second sub down currents flow from the output terminal.

The charge pump generating such balanced and constant up/down currents according to the present invention may be used to particular advantage for reducing jitter in a phase locked loop. In that case, the first control signal is an up signal generated by a phase frequency detector in the phase locked loop, and the second control signal is a down signal generated by the phase frequency detector.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2A, 2B, 3, 4, 5, 6, 7A, 7B, 8, and 9 refer to elements having similar structure and/or function.

DETAILED DESCRIPTION OF THE INVENTION

Figure 5:
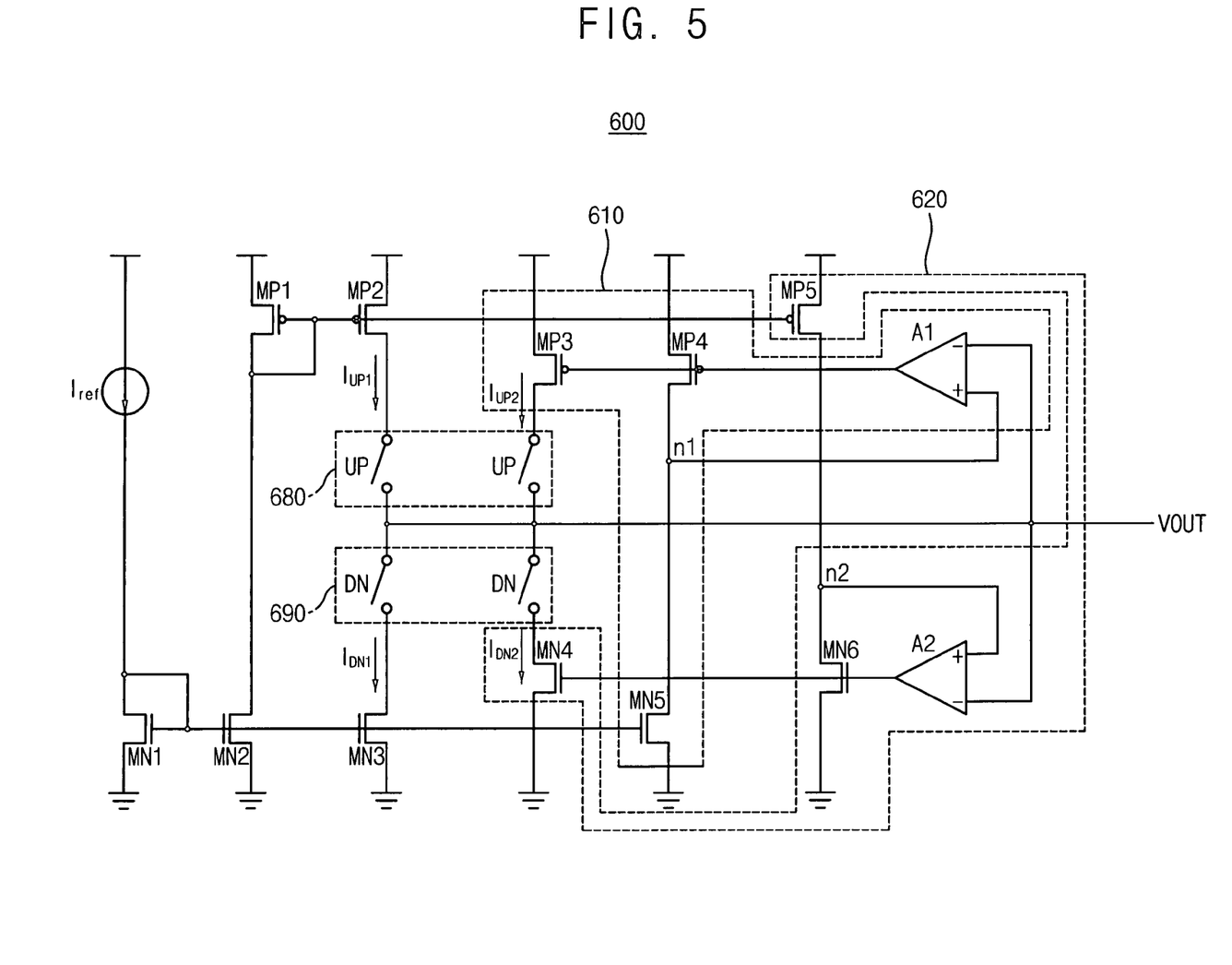
FIG. 5 is a circuit diagram of a charge pump according to an example embodiment of the present invention.

FIG. 5 is a circuit diagram of a charge pump 600 according to an example embodiment of the present invention. Referring to FIG. 5, the charge pump 600 includes a reference current source Iref, PMOS transistors MP1 and MP2, NMOS transistors MN1, MN2 and MN3, a first current source 610, and a second current source 620. The reference current source Iref, the PMOS transistors MP1 and MP2, and the NMOS transistors MN1, MN2 and MN3 are similar in function to analogous elements of the prior art charge pump in FIG. 3.

That is, the NMOS transistor MN1 and the PMOS transistor MP1 form a current mirror with the NMOS transistor MN2 and the PMOS transistor MP2, respectively, to generate a first sub up current IUP1 proportional to a current flowing through the reference current source Iref. The NMOS transistor MN1 and the NMOS transistor MN3 form a current mirror to generate a first sub down current IDN1 proportional to the current flowing through the reference current source Iref.

The first current source 610 includes PMOS transistors MP3 and MP4, an NMOS transistor MN5, and an operational amplifier A1 to generate a second sub up current IUP2. The first and second sub up currents IUP1 and IUP2 vary complementarily with a change of an output voltage VOUT of the charge pump 600. Additionally, the second current source 620 includes a PMOS transistor MP5, NMOS transistors MN4 and MN6, and an operational amplifier A2 to generate a second sub down current IDN2. The first and second sub down currents IDN1 and IDN2 vary complementarily with a change of an output voltage VOUT of the charge pump 600.

The first current source 610 generates the second sub up current IUP2 that is substantially replicated from the first sub down current IDN1. The second current source 620 generates the second sub down current IDN2 that is substantially replicated from the first sub up current IUP1. Thus, the sum of the first and second sub up currents IUP1 and IUP2 is substantially equal to the sum of the first and second sub down currents IDN1 and IDN2.

The sum of the first and second sub up currents IUP1 and IUP2 forms the up current, and the sum of the first and second sub down currents IDN1 and IDN2 forms the down current. Thus, the up and down currents are balanced according to example embodiments of the present invention. In addition, the sub up currents IUP1 and IUP2 vary complementarily with a change of the output voltage VOUT, and the sub down currents IDN1 and IDN2 vary complementarily with the change of the output voltage. Thus, the up and down currents as a respective sum of such sub currents (IUP1 and IUP2, IDN1 and IDN2) remain substantially constant independent of the change in the output voltage VOUT of the charge pump 600.

The sub up currents IUP1 and IUP2 varying complementarily means that when the first sub up current IUP1 is increased (or decreased) according to a variance in the output voltage VOUT, the second sub up current IUP2 is correspondingly decreased (or increased) by as much. Even when the variances in the first and second sub up currents IUP1 and IUP2 are not exactly identical, the change in the total up current is still reduced with the output voltage VOUT.

Similarly, the sub down currents IDN1 and IDN2 varying complementarily means that when the first sub down current IDN1 is increased (or decreased) according to a variance in the output voltage VOUT, the second sub down current IDN2 is correspondingly decreased (or increased) by as much. Even when the variances in the first and second sub down currents IDN1 and IDN2 are not exactly identical, the change in the total down current is still reduced with the output voltage VOUT.

The replication of the second sub up current IUP2 from the first sub down current IDN1 in the charge pump of FIG. 5 is now described. In the first current source 610, the NMOS transistors MN3 and MN5 form a first current mirror to have the first sub down current IDN1 flowing through the NMOS transistor MN5. The PMOS transistor MP4 is coupled in series with the NMOS transistor MN5 at a first reference node n1 such that the first sub down current IDN1 flows through the PMOS transistor MP4.

Further in the first current source 610, the operational amplifier A1 replicates the output voltage VOUT of the charge pump at the first reference node n1 so that a drain-to-source voltage Vds of the NMOS transistor MN5 is substantially the same as the drain-to-source voltage Vds of the NMOS transistor MN3. Therefore, the first sub down current IDN1 (i.e., the second sub up current IUP2) depends on the drain-to-source voltage Vds of the NMOS transistor MN5 which is complementary to the first sub up current IUP1 depending on the source-to-drain voltage Vsd of the PMOS transistor MP2.

The operational amplifier A1 receives a voltage at the first reference node n1 on a positive input terminal and receives the output voltage VOUT on a negative input terminal to amplify the difference there-between to output a first low impedance output. The first low impedance output is applied to respective gates of the PMOS transistors MP3 and MP4. Since the PMOS transistors MP3 and MP4 form a current mirror, the gate-to-source voltages of such transistors MP3 and MP4 are substantially equal. In addition, the drain-to-source voltages of such transistors MP3 and MP4 are substantially equal.

Therefore, the PMOS transistors MP3 and MP4 have substantially the same current (i.e., IDN1=IUP2) flowing there-through. The PMOS transistors MP3 and MP4 and the operational amplifier A1 form a first current replication loop that replicates the output voltage VOUT at the first reference node n1.

The replication of the second sub down current IDN2 from the first sub up current IUP1 of the charge pump 600 in FIG. 5 is now described. The PMOS transistor MP5 forms a current mirror with the PMOS transistor MP2 such that the first sub up current IUP1 flows through the PMOS transistor MP5. The NMOS transistor MN6 is coupled in series with the PMOS transistor MP5 at a second reference node n2 such that the first sub up current IUP1 flows through the NMOS transistor MN6.

The operational amplifier A2 replicates the output voltage VOUT of the charge pump at the second reference node n2 so that the drain-to-source voltages Vds of the NMOS transistors MN4 and MN6 are substantially equal. Therefore, the first sub up current IUP1 (i.e., the second sub down current IDN2) depends on the source-to-drain voltage Vsd of the PMOS transistor MP5 which is complementary to the first sub down current IDN1 depending on the drain-to-source voltage Vds of the NMOS transistor MN3.

The operational amplifier A2 receives the voltage at the second reference node n2 on a positive input terminal and receives the output voltage VOUT on a negative input terminal to amplify the difference there-between to output a second low impedance output. The second low impedance output is applied to respective gates of the NMOS transistor MN4 and the NMOS transistor MN6. Since the NMOS transistors MN4 and MN6 form a current mirror, the gate-to-source voltages of such transistors MN4 and MN6 are substantially equal. In addition, the drain-to-source voltages of such transistors MN4 and MN6 are substantially equal.

Therefore, the NMOS transistors MN4 and MN6 have substantially the same current (i.e., IUP1=IDN2) flowing there-through. The NMOS transistors MN4 and MN6 and the operational amplifier A2 form a second current replication loop that replicates the output voltage VOUT at the second reference node n2.

The charge pump 600 also includes up switches 680 that are closed when the UP signal (i.e., a first control signal) is activated such that the sub up currents IUP1 and IUP2 flow to the output terminal to increase the output voltage VOUT thereon. The charge pump 600 also includes down switches 690 that are closed when the DN signal (i.e., a second control signal) is activated such that the sub down currents IDN1 and IDN2 flow from the output terminal to decrease the output voltage VOUT thereon.

Figure 6:
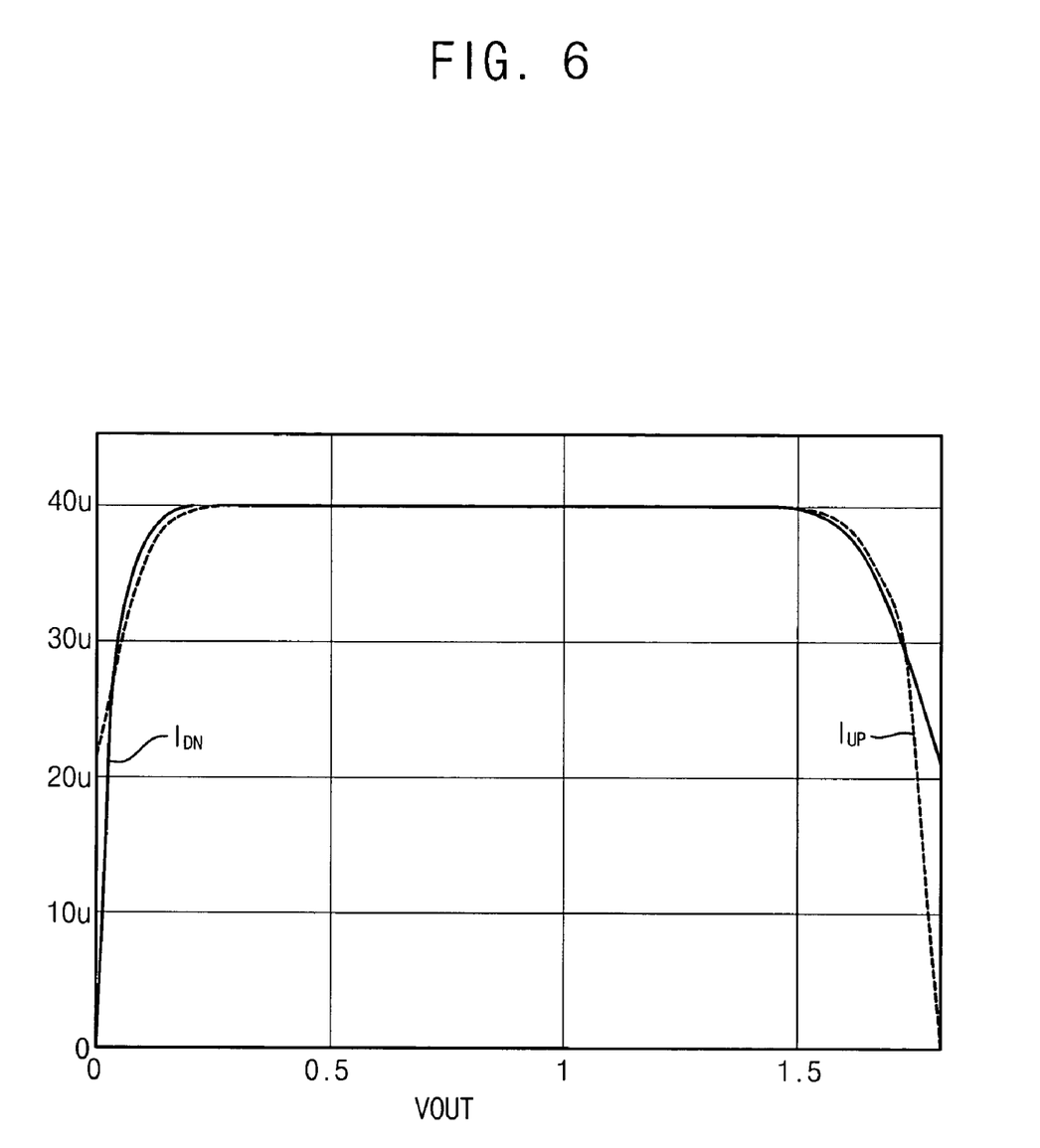
FIG. 6 is a plot of simulation results for up and down currents with variation of an output voltage of the charge pump in FIG. 5.
Figure 9:
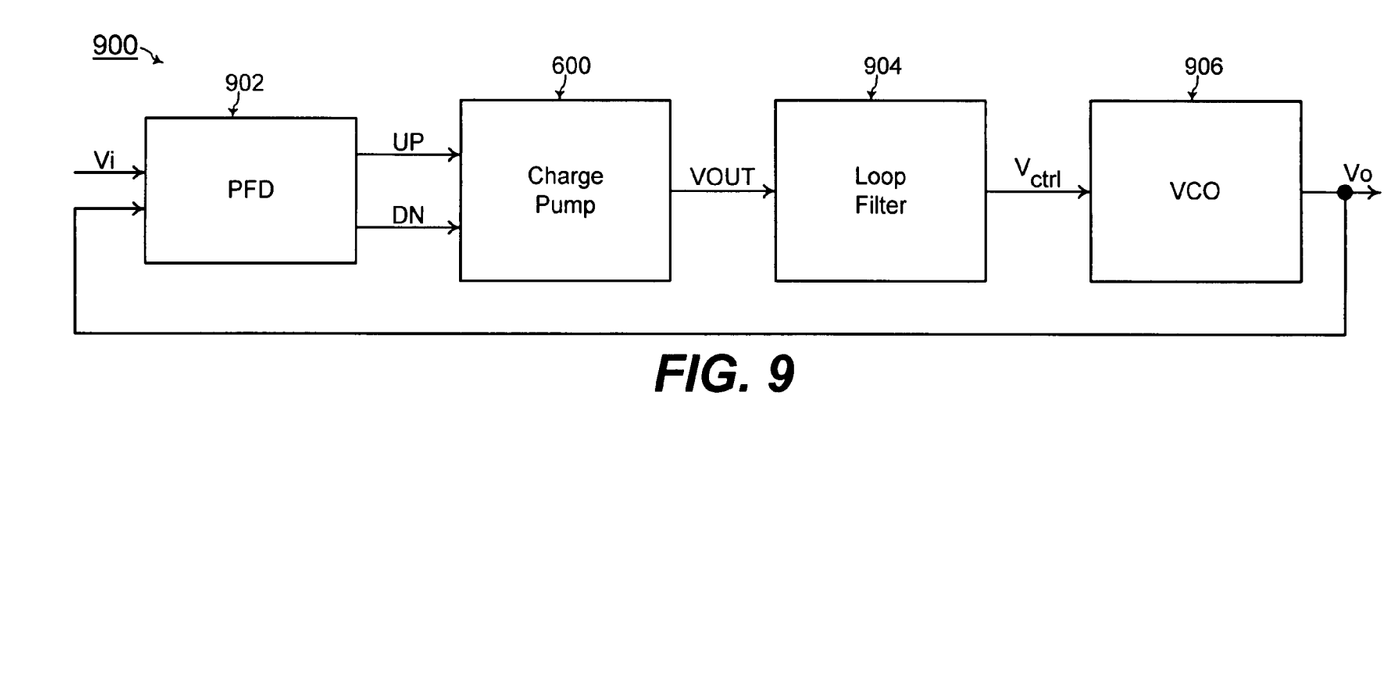
FIG. 9 shows a block diagram of a phase locked loop having the charge pump of FIG. 5, according to an example embodiment of the present invention.

Referring to FIGS. 6 and 9, the UP and DN signals are generated from a phase frequency detector 902 of a phase-locked loop 900 in one embodiment of the present invention. One of the UP and DN signals is activated by the phase frequency detector 902 from comparing a phase (or frequency) of a reference signal Vi and a feed-back signal Vo. The UP and DN signals control the charge pump 600 to generate the sub up currents IUP1 and IUP2 or the sub down currents IDN1 and IDN2.

Such sub currents are used by a loop filter to generate a loop filter voltage VCTRL sent to a VCO (voltage controlled oscillator) 906 to generate the feedback signal Vo which is also the output signal of the phase locked loop 900. One of the UP and DN signals is activated by the phase frequency detector 902 at a time for reducing a phase (or frequency) difference between the reference signal Vi and the feed-back signal Vo.

The operation of the charge pump 600 with the variance of the output voltage VOUT at the output terminal is now described. Referring to FIG. 5, when the output voltage VOUT is increased, the source-to-drain voltage Vsd of the PMOS transistor MP2 is decreased, thereby decreasing the first sub up current IUP1. Conversely, the drain-to-source voltage Vds of the NMOS transistor MN3 is increased so that the first sub down current IDN1 is increased. Since the second sub up current IUP2 is replicated from the first sub down current IDN1, the second sub up current IUP2 is increased. That is, the second sub u p current IUP2 is changed complementarily with the first sub up current IUP1. Thus, the resulting variance in the total up current (IUP1+IUP2) is reduced with a change in the output voltage VOUT.

In addition, since the second sub down current IDN2 is replicated from the first sub up current IUP1, the second sub down current IDN2 is decreased. That is, the second sub down current IDN2 is changed complementarily with the first sub down current IDN1. Thus, the resulting variance in the total down current (IDN1+IDN2) is reduced with a change in the output voltage VOUT. In addition, the total up current and the total down current have insignificant mismatch from such complementary relationships between each of the sub up currents IUP1 and IUP2 and the sub down currents IDN1 and IDN2.

When the output voltage VOUT is decreased, the Vsd of the PMOS transistor MP2 is increased so that the first sub up current IUP1 is increased, whereas the Vds of the NMOS transistor MN3 is decreased so that the first sub down current IDN1 is decreased. Since the second sub up current IUP2 is replicated from the first sub down current IDN1, the second sub up current IUP2 is also decreased. That is, the second sub up current IUP2 is changed complementarily with the first sub up current IUP1. Thus, the resulting variance in the total up current (IUP1+IUP2) is reduced with the output voltage VOUT.

In addition, since the second sub down current IDN2 is replicated from the first sub up current IUP1, the second sub down current IDN2 is increased. That is, the second sub down current IDN2 is changed complementarily with the first sub down current IDN1. Thus, the resulting variance in the total down current (IDN1+IDN2) is reduced with the output voltage VOUT. In addition, the total up current and the total down current have insignificant mismatch from such complementary relationships between each of the sub up currents IUP1 and IUP2 and the sub down currents IDN1 and IDN2.

FIG. 6 is a plot illustrating simulation results for the total up current IUP and the total down current IDN depending on the output voltage VOUT of the charge pump 600 in FIG. 5. The simulation results of FIG. 6 are for when the output voltage VOUT at the output terminal varies in a range from about 0V to about the VDD (e.g., about 1.8V). In FIG. 6, the total up current IUP and the total down current IDN are maintained to be substantially constant when the output voltage VOUT is in a range from about 0.2V to about 1.6V.

Figure 7A:
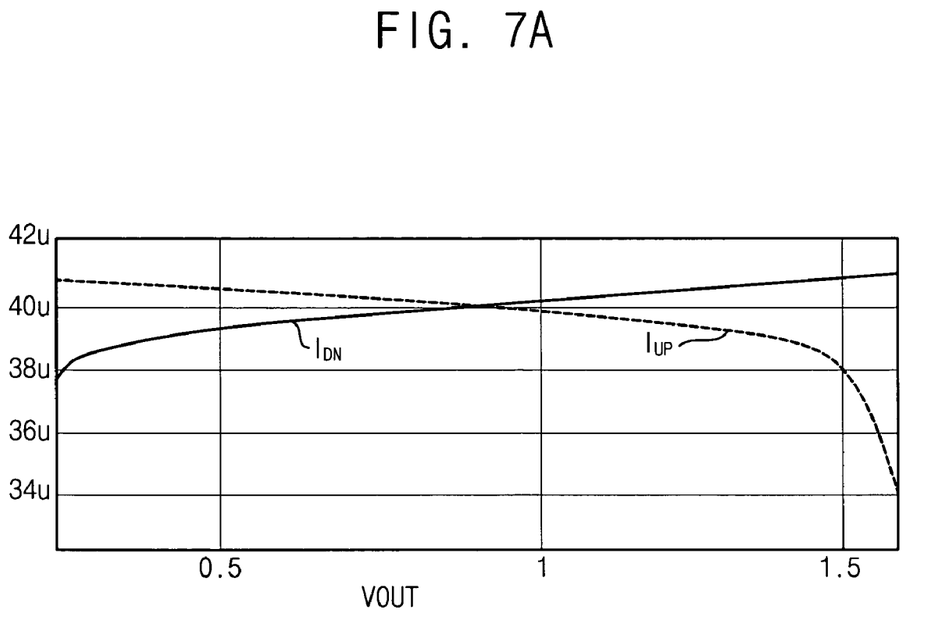
FIGS. 7A and 7B are partially enlarged views of portions of the plots of FIGS. 4 and 6, respectively.
Figure 7B:
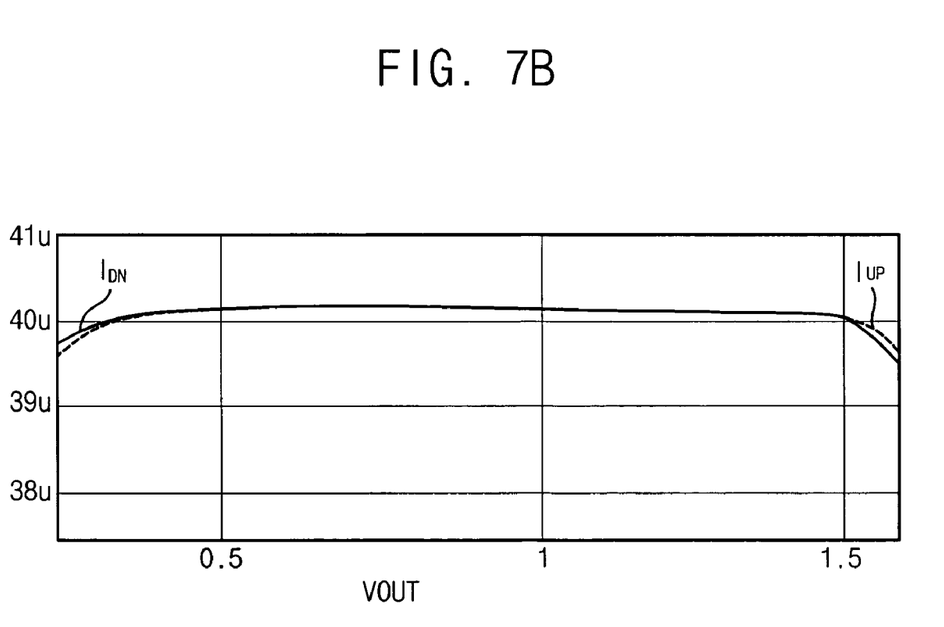

FIG. 7A is an enlarged view of a portion of the plot of FIG. 4, and FIG. 7B is an enlarged view of a portion of the plot of FIG. 6. Referring to FIGS. 7A and 7B, when the output voltage VOUT of the charge pump varies in a range from about 0.2V to about 1.6V, the total up and down currents IUP and IDN generated by the charge pump 600 according to an example embodiment of the present invention are maintained more constant than with the conventional charge pump of FIG. 3.

Figure 8:
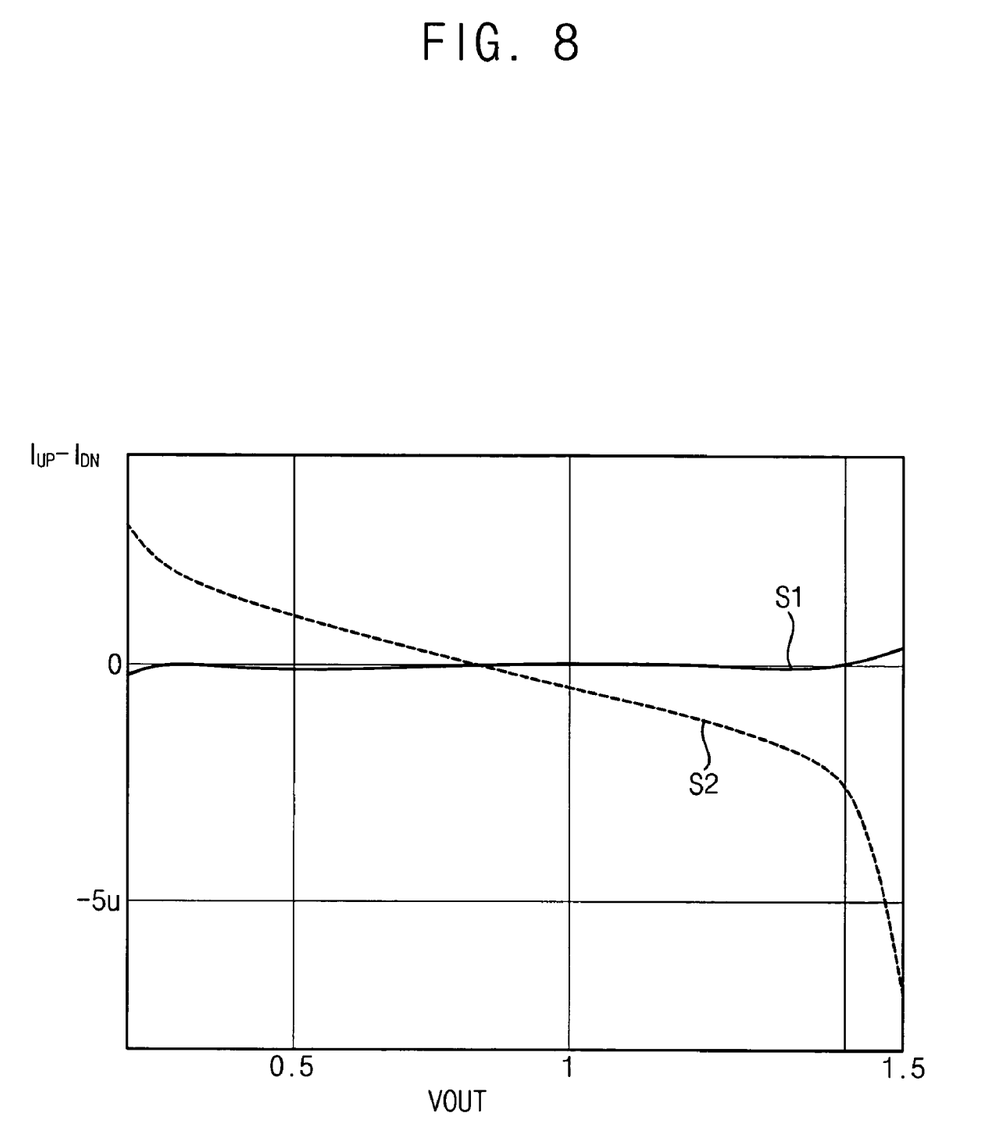
FIG. 8 is a plot of simulation results for a current mismatch between the up and down currents of the charge pumps in FIGS. 3 and 5.

FIG. 8 is a plot illustrating simulation results for a current mismatch between the total up current IUP and the total down current IDN in the charge pumps of FIGS. 3 and 5. In FIG. 8, S1 represents a simulation result for a charge pump according to an example embodiment of the present invention, and S2 represents a simulation result for the conventional charge pump. Referring to FIG. 8, the charge pump according to an example embodiment of the present invention in FIG. 5 has substantially eliminated the mismatch between the total up and down currents IUP and IDN compared with the conventional charge pump of FIG. 3 when the output voltage VOUT of the charge pump is in a range from about 0.2V to about 1.6V.

With such reduced mismatch in the up and down currents IUP and IDN that are maintained to be substantially constant, the jitter of the phase-locked loop 900 using the charge pump 600 may be advantageously reduced for enhanced performance of the phase-locked loop 900.

Having thus described example embodiments of the present invention, it is to be understood that the invention defined by the appended claims is not to be limited by particular details set forth in the above description as many apparent variations thereof are possible without departing from the spirit or scope thereof as hereinafter claimed. While the example embodiments of the present invention and their advantages have been described in detail, it should be understood that various changes, substitutions and alterations may be made herein without departing from the scope of the invention.

What is claimed is:

1. A method of operating a charge pump comprising:
    generating a first sub up current and a second sub up current that vary complementarily with a change in voltage at an output terminal, wherein each of the first and second sub up currents flows into the output terminal for charging the output terminal; and
    generating a first sub down current and a second sub down current that vary complementarily with the change in the voltage at the output terminal, wherein each of the first and second sub down currents flows away from the output terminal for discharging the output terminal.

2. The method of claim 1, wherein the generating the second sub up current and the generating the second sub down current respectively include:
    replicating the first sub down current to generate the second sub up current; and
    replicating the first sub up current to generate the second sub down current.

3. The method of claim 1, further comprising:
    flowing the first and second sub up currents to the output terminal in response to a first control signal; and
    flowing the first and second sub down currents from the output terminal in response to a second control signal.

4. The method of claim 1, wherein the voltage at the output terminal controls a voltage controlled oscillator in a phase locked loop.

5. A charge pump comprising:
    sub up current sources for generating a first sub up current and a second sub up current that vary complementarily with a change in a voltage at an output terminal, wherein each of the first and second sub up current flows into the output terminal for charging the output terminal; and sub down current sources for generating a first sub down current and a second sub down current that vary complementarily with the change in the voltage at the output terminal, wherein each of the first and second sub down currents flows away from the output terminal for discharging the output terminal.

6. The charge pump of claim 5, wherein the sub up current sources include:
a first sub up current source for generating the first sub up current that is mirrored from a reference current; and
a second sub up current source for generating the second sub up current that is mirrored from the first sub down current.

7. The charge pump of claim 6, wherein the first sub up current source is comprised of a pair of NMOS transistors forming a first current mirror, and a pair of PMOS transistors for forming a second current mirror.

8. The charge pump of claim 6, wherein the second sub up current source includes:
a pair of NMOS transistors forming a first current mirror and a pair of PMOS transistors forming a second current mirror coupled to the first current mirror at a common node;
wherein each of the first and second current mirrors have the first sub down current flowing therein; and
an operational amplifier configured to maintain a voltage at the common node substantially equal to the voltage at the output terminal.

9. The charge pump of claim 5, wherein the sub down current sources include:
a first sub down current source for generating the first sub down current that is mirrored from a reference current; and
a second sub down current source for generating the second sub down current that is mirrored from the first sub up current.

10. The charge pump of claim 9, wherein the first sub down current source is comprised of a pair of NMOS transistors forming a current mirror.

11. The charge pump of claim 9, wherein the second sub down current source includes:
a pair of PMOS transistors forming a first current mirror and a pair of NMOS transistors forming a second current mirror coupled to the first current mirror at a common node;
wherein each of the first and second current mirrors have the first sub up current flowing therein; and
an operational amplifier configured to maintain a voltage at the common node substantially equal to the voltage at the output terminal.

12. The charge pump of claim 5, further comprising:
up switches that close in response to a first control signal such that the first and second sub up currents flow to the output terminal; and
down switches that close in response to a second control signal such that the first and second sub down currents flow from the output terminal.

13. The charge pump of claim 12, wherein the first control signal is an up signal generated by a phase frequency detector in a phase locked loop, and wherein the second control signal is a down signal generated by the phase frequency detector.

14. A phase-locked loop comprising:
a phase frequency detector for activating an up signal or a down signal from comparing a reference signal with a feed-back signal;

a charge pump including:
sub up current sources for generating a first sub up current and a second sub up current that vary complementarily with a change in a voltage at an output terminal;
sub down current sources for generating a first sub down current and a second sub down current that vary complementarily with the change in the voltage at the output terminal;
wherein the first and second sub up currents flow to the output terminal when the up signal is activated, and wherein the first and second sub down current from the output terminal when the down signal is activated;
a loop filter for filtering the voltage at the output terminal to generate a loop filter voltage; and
a voltage controlled oscillator for generating the feedback signal in response to the loop filter voltage.

15. The phase-locked loop of claim 14, wherein the charge pump further includes:
up switches that close when the up signal is activated such that the first and second sub up currents flow to the output terminal; and
down switches that close when the down signal is activated such that the first and second sub down currents flow from the output terminal.

16. The phase-locked loop of claim 14, wherein the charge pump further includes:
a first sub up current source for generating the first sub up current that is mirrored from a reference current;
a second sub up current source for generating the second sub up current that is mirrored from the first sub down current;
a first sub down current source for generating the first sub down current that is mirrored from the reference current; and
a second sub down current source for generating the second sub down current that is mirrored from the first sub up current.

17. The phase-locked loop of claim 16, wherein the first sub up current source is comprised of a pair of NMOS transistors forming a first current mirror, and a pair of PMOS transistors for forming a second current mirror.

18. The phase-locked loop of claim 16, wherein the second sub up current source includes:
a pair of NMOS transistors forming a first current mirror and a pair of PMOS transistors forming a second current mirror coupled to the first current mirror at a common node;
wherein each of the first and second current mirrors have the first sub down current flowing therein; and
an operational amplifier configured to maintain a voltage at the common node substantially equal to the voltage at the output terminal.

19. The phase-locked loop of claim 16, wherein the first sub down current source is comprised of a pair of NMOS transistors forming a current mirror.

20. The phase-locked loop of claim 16, wherein the second sub down current source includes:
a pair of PMOS transistors forming a first current mirror and a pair of NMOS transistors forming a second current mirror coupled to the first current mirror at a common node;
wherein each of the first and second current mirrors have the first sub up current flowing therein; and
an operational amplifier configured to maintain a voltage at the common node substantially equal to the voltage at the output terminal.

* * * * *